(12) United States Patent
Benning et al.

(10) Patent No.: US 7,057,353 B2
(45) Date of Patent: Jun. 6, 2006

(54) ELECTRONIC DEVICE WITH WIDE LENS FOR SMALL EMISSION SPOT SIZE

(75) Inventors: Paul Benning, Lexington, MA (US); Huei-Pei Kuo, Cupertino, CA (US); William R Knight, Corvallis, OR (US); Paul H McClelland, Monmouth, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 123 days.

(21) Appl. No.: 10/341,687

(22) Filed: Jan. 13, 2003

(65) Prior Publication Data

US 2004/0135519 A1    Jul. 15, 2004

(51) Int. Cl.
*G09G 3/10* (2006.01)

(52) U.S. Cl. ............................. 315/169.3; 315/169.1; 313/345

(58) Field of Classification Search .......... 315/169.1, 315/169.3; 313/495, 491, 306; 345/306
See application file for complete search history.

(56) References Cited

U.S. PATENT DOCUMENTS

| | | | |
|---|---|---|---|
| 5,633,507 A | 5/1997 | Pfeiffer et al. | 250/492.23 |
| 5,691,541 A | 11/1997 | Ceglio et al. | 250/492.1 |
| 5,850,120 A | 12/1998 | Okamoto | 315/169.1 |
| 5,877,594 A * | 3/1999 | Miyano et al. | 315/169.1 |
| 5,981,962 A | 11/1999 | Groves et al. | 250/492.23 |
| 6,188,167 B1 | 2/2001 | Endo et al. | 313/495 |
| 6,194,838 B1 | 2/2001 | Beeteson et al. | 315/169.3 |
| 6,333,508 B1 | 12/2001 | Katsap et al. | 250/492.2 |
| 6,400,068 B1 | 6/2002 | Jaskie et al. | 313/495 |
| 6,400,090 B1 | 6/2002 | Katsap et al. | 315/111.81 |
| 6,429,596 B1 * | 8/2002 | Jamison et al. | 315/111.81 |
| 6,522,061 B1 * | 2/2003 | Lockwood | 313/495 |
| 6,680,564 B1 | 1/2004 | Tomii | 313/306 |
| 2001/0015615 A1 | 8/2001 | Xia | 313/495 |
| 2002/0193036 A1 | 12/2002 | Benning et al. | 315/169.3 |

OTHER PUBLICATIONS

Junji Itoh et al. "Fabrication of double-gated Si field emitter arrays for focused electron beam generation"; Journal of Vacuum Science & Technology; Sep. 1995.

Search Report for European Patent Application No. EP03257067, filed Nov. 10, 2003. Report completed May 18, 2005.

* cited by examiner

Primary Examiner—Wilson Lee
Assistant Examiner—Jimmy Vu

(57) ABSTRACT

An electronic device of the invention includes a tip emitter formed in a well that is defined in a substrate. An extractor disposed about the well extracts emissions from the tip emitter. A wide lens focuses the emissions through its opening. The opening is sufficiently large and spaced far enough away to encompass the majority of a divergence angle of the emissions. The emissions are focused into a spot.

54 Claims, 10 Drawing Sheets

ELECTRONIC DEVICE WITH WIDE LENS FOR SMALL EMISSION SPOT SIZE

FIELD OF THE INVENTION

The invention is in the microelectronics field. The invention particularly concerns devices making use of focused emissions from emitters.

BACKGROUND OF THE INVENTION

Computing technology continues to become less expensive while providing more capability. Physical dimensions have shrunk to meet portability goals. Power consumption should be minimized, especially in portable devices that require portable power supplies, e.g., batteries.

High power requirements of conventional memory devices, e.g., hard disk drives, limit long-term battery operation. Microprocessors consume small amounts of power compared to such ancillary devices. Higher speed devices are also desirable. Criticism has been voiced in the trade press about the inability of mass storage devices such as disk drives, CD-ROMs, and DVD drives, to name a few, to keep up with the advancing speed of the microprocessors.

Electron emitters that create electron beams present the basis for alternative possible solutions for memories, electronic chip fabrication equipment, and other devices. Electron beam technology has been present for many years in consumer products such as television (TV) tubes and computer monitors. These devices use what is known as hot cathode electrodes to create a source of electrons that are directed to and focused on the viewing screen. These hot cathode emitters are ill-suited for computer scale devices due their large size, high temperature and high power consumption. The trend, even in television, is to move toward a more compact solution. Plasma and LCD televisions are examples of the trend away from the bulky, hot cathode technology.

While research has taken place in a number of new technological fields, the field of cold cathode electron emitters such as tip and flat emitters has attracted the attention of many manufacturers. Several problems exist in converting this cold cathode technology to products. One such problem is the creation of an electron focusing structure that can be used in multiple applications that require a high density of emitting devices such as with mass storage devices.

A typical tip or flat emitter driven memory device is based upon the controlled use of electron emissions from an emitter. An emitter emits electrons in response to an electrical signal. Controlled emissions form a basis to create useful electrical and optical effects. Focused emissions can affect various media to produce, for example, memory and lithography effects. These and other applications require the use of controlled and focused electron beams. Production of such beams involves the fabrication of an emitter and focusing structure, typically an electrostatic lens.

Various emitter driven devices make use of a target anode medium. The target anode medium is the focus point for the controlled emissions. A target anode medium is held at hundreds of volts differential from the emitter/cathode structure. Alignment and focusing length are important issues in emitter driven devices. Fabrication of lenses on emitter chips requires the precise alignment of the emitters and focusing elements. To achieve alignment, standard practice for micro-fabricated emitters is to form the entire lens and emitter structure in a single self-aligned photostep. This achieves good lens/emitter alignment, but fixes the distance of the lens from the emitter and also limits the thickness of the lens. Generally, the lens is the same distance from an extractor as the extractor is from a tip emitter formed in a well. The focusing length is accordingly limited to the short distance afforded by the separation of various metal layers in an emitter/focusing lens chip.

The single self-aligned photostep process further sets the diameter of the lens to that of the well; since both are formed from the same etch. Due to the common size of the extractor and lens and their relative positions, the divergence angle of the emission beam from the emitter is wider than the lens. This adversely affects the ability to produce tightly focused spots from the emissions. A tightly focused spot size, e.g., less than 35 nm, is desirable to increase density of a memory and a narrowly diverging beam is desirable for a scientific instrument or a lithography tool. Some conventional devices have achieved spot sizes of about 40 nm by using apertures to block a substantial amount of stray emissions. Efficiency, as measured by the percentage of electron emissions that are used to produce the focused spot, is accordingly low. Significant aperturing to reduce spot size can reduce emission efficiency 100× to 10,000×. Other approaches to reduce spot size include the use of multiple lenses and high acceleration voltages. High voltages conflict with power consumption and may not be available in certain portable devices. Complex lensing can raise manufacturing costs, and may be difficult to implement in a high volume manufacturing process.

The conventional well housing a tip emitter also is deep. The standard small lens size requires an extremely precise alignment, ~0.04 μm, between the tip/extractor and lens. As mentioned, a single etch produces the well and lens to achieve the alignment, and aspect ratios of the well are generally high, about 2 to 1 (depth to diameter). This creates processing complexity because it is harder to deposit a tip emitter in a deep well as the coating of the inside of the well is to be avoided while forming the emitter tip. This may require more sophisticated tooling, e.g., larger evaporators. Deep wells can also produce poor emitter tip quality and low yields.

SUMMARY OF THE INVENTION

An electronic device of the invention includes a tip emitter formed in a well that is defined in a substrate. An extractor disposed about the well extracts emissions from the tip emitter. A wide lens focuses the emissions through its opening. The opening is sufficiently large and spaced far enough away to encompass the majority of a divergence angle of the emissions. The emissions are focused into a spot.

DETAILED DESCRIPTION OF THE INVENTION

Figure 1:
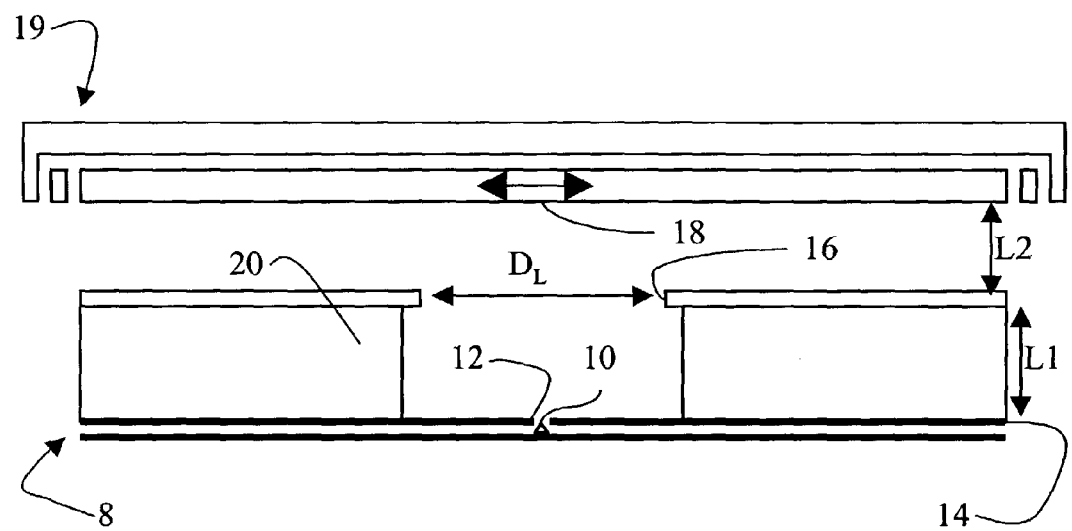
FIG. 1 is a schematic cross section side view of a preferred embodiment electronic device.

An electronic device of the invention will be realized with a focusing lens that is formed as a structure upon the extractor of an emitter device after the emitter device is formed. The lens is made significantly wider than the extractor to encompass divergent electrons. The lens is also spaced a substantial distance away from the extractor to lengthen the electron flight path compared to conventional devices and permit a single lens to achieve a small focus spot size. In some embodiments, no aperture is used. In alternate embodiments, aperturing is used at the extractor to further reduce spot size. The use of a separately formed focus lens according to the invention permits the relative size of the lens to be determined independently from the size of the extractor/tip well. The separately formed focus lens can be placed at a desired distance from the extractor, e.g., it may be formed on a thick dielectric to move it away from the extractor. As the emitter and its well are formed first, a small aspect ratio may be used to simply the formation of the tip emitter in its well.

A preferred electronic device of the invention includes a focusing lens that is spaced apart from a tip emitter. A depth to diameter aspect ratio for an emitter well may be in the approximate range of 0.75:1–1.25:1 in a preferred embodiment, as the spaced apart lens is formed separately from the emitter and the well may be independently defined. In embodiments of the invention, the lens is far enough away and wide enough to encompass a majority of the divergence angle of emissions, and in particular preferred embodiments the entire divergence angle of the emissions is encompassed. A preferred embodiment has a relationship of the diameter of the lens compared to the distance lens is spaced apart from the emitter extractor of between 1:1 and 6:1.

The invention will now be illustrated with respect to preferred embodiment electronic devices and representative devices incorporating the preferred embodiment electronic devices. In describing the invention, particular exemplary devices, formation processes, and device applications will be used for purposes of illustration. Dimensions and illustrated devices may be exaggerated for purposes of illustration and understanding of the invention. The elements of the drawings are not necessarily to scale relative to each other. Rather, emphasis has instead been placed upon clearly illustrating the invention. Furthermore, like reference numerals designate corresponding similar though not necessarily exact parts through the several views. A single electronic device illustrated in conventional fashion by a two-dimensional schematic layer structure will be understood by artisans to provide teaching of three-dimensional electronic device structures. Devices and processes of the invention may be carried out with conventional integrated circuit fabrication equipment, as will also be appreciated by artisans.

FIG. 1 illustrates an electronic device of the invention. A substrate 8 includes a tip emitter 10, e.g., a Spindt tip, in a well 12. The substrate 8 may also include additional emitters, and may form part of an integrated device including control electronics, power supplies and the like. The emitter 10 emits electrons under control of an extractor 14. The electron flight path has a substantial length L1 (~2–~10 µm) before a wide and distant electrostatic lens 16 focuses the emissions. The lens 16 is wide enough to encompass at least the majority of the divergence angle of emissions from the tip emitter 10, and distant enough to permit the lens 16 to achieve a tight spot focus of emissions unto a medium 18. In preferred embodiments, the target medium 18 is movable relative to the lens/extractor/emitter structure, for example by a micromover 19 applied to the target medium 18. The micromover 19 acts as a stator and the target medium 18 as a rotor. Exemplary micromovers include, for example, springs, piezo, screw and comb micromover assemblies. Alternatively, the mover may be applied to the lens/extractor/emitter structure.

The target medium 18 can be chosen to create different types of devices. For example, the target medium 18 may be a memory medium with the use of phase change material, an exemplary material being $In_2Se_3$. Other phase change materials are known to those skilled in the art. Another possibility is a lithography application, in which case an electron beam resist material, e.g., polymethylmethacrylate (PMMA), is suitable for the target medium, which may comprise a wafer coated with the electron beam resist material. The target medium 18 is held at a voltage, e.g., 700 V, to help accelerate electron emissions toward it.

Preferably, the lens' opening encompasses the entire divergence angle of emissions from the tip emitter 10. A diameter $D_L$ in the range of ~3 to ~10 µm is suitable. The ratio of $D_L$ to L1 may fall into a range from above 1:1 to 6:1. The medium 18 is a distance L2, e.g. 1 to 10 µm, at the focus point of emissions. When the divergence angle of emissions is fully encompassed, 100% emission efficiency may be realized. In addition, the wide lens spaced substantially away from the medium 18 may achieve very small spot sizes of ~35 nm and smaller, and more preferably to less than ~10 nm.

The lens 16 is formed upon the emitter/extractor structure after the emitter 10 and extractor have been formed. Suitable materials for the electron supply layer 22 (FIG. 2), the extractor 14 and the lens 16 include any conductors amenable to the fabrication process being employed and the other materials employed. Preferred conductors include TiN, Au, Al, and Ta. A thick dielectric layer 20 achieves the distance L1. Low stress dielectrics 20 may be used for the layer 20. Preferred examples include TEOS (Si-oxide), SiN, and SiC.

Figure 2:
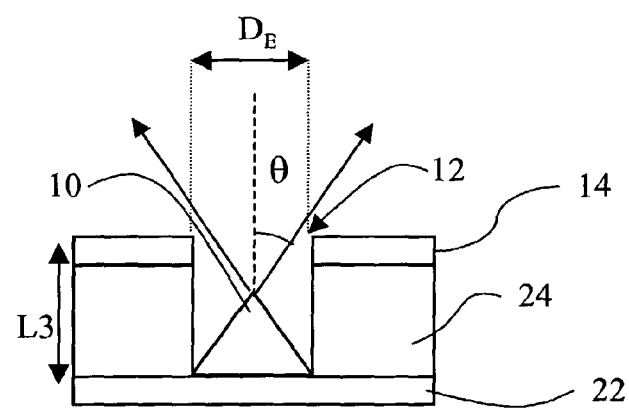
FIG. 2 is a schematic cross section side view of the emitter and well from the FIG. 1 electronic device.

Referring now to FIG. 2, the tip emitter 10 is shown in its well 12. Suitable exemplary tip emitters include tip emitters formed from Mo, Nb, NbC, and Pt. Because the emitter/extractor structure is formed separately from the lens, a deep well may be avoided. The well 12 has a depth (L3) to diameter (diameter $D_E$) ratio in the approximate range of 0.75:1–1.25:1, and is preferably 1:1. Formation of tip emitters 10 in the shallow wells, e.g. a ~0.3 μm–~0.5 diameter and ~0.4–~0.6 μm deep well, should increase manufacturing yields compared to processes with the common 2:1 aspect ratio wells that result from the self-aligned formation processes that etch the emitter well in a single step along with the lens opening. In the shallow wells, there is a less of a tendency of tip material to coat walls of the well during formation of the tip. An exemplary preferred embodiment in accordance with FIGS. 1 and 2, has the following parameters: $D_L$ ~7.5 μm, $D_E$ ~0.5 μm, L1 ~5 μm, L2 ~3 μm, and L3 ~0.4 μm. An electron supply metal layer 22 and the extractor metal layer 14 are ~0.1 μm. A dielectric layer 24 separates the electron supply and the extractor metal layer 14.

The emitter/extractor/lens structure is preferably fabricated with semiconductor device technology. The devices of the present invention are applicable to a broad range of semiconductor devices technologies and can be fabricated from a variety of semiconductor materials. Preferred devices may be implemented in the silicon material systems. Group III–V materials may also be used. Accordingly, the present invention is not intended to be limited to those devices fabricated in silicon semiconductor materials, but will include those devices fabricated in one or more of the available semiconductor materials and technologies available to those skilled in the art. Without intending to limit the invention, another example is the thin-film-transistor (TFT) technology using polysilicon on glass substrates.

A divergence angle θ of emission is shown in FIG. 2. As mentioned, it is preferred that the lens 16 be wide enough to encompass the entire divergence angle θ of emissions. A smaller divergence angle will contribute to the ability to obtain a smaller spot size.

Figure 3:
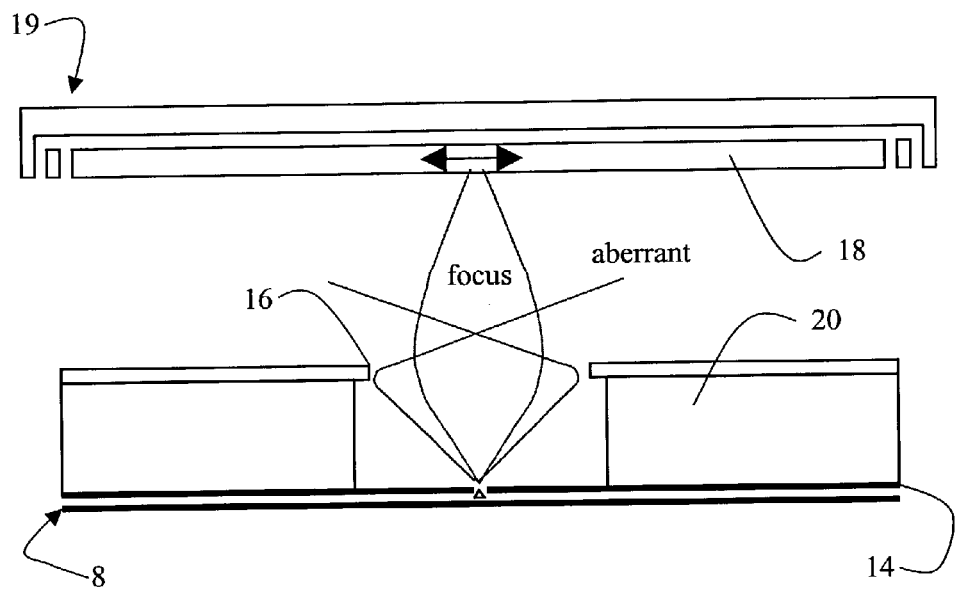
FIG. 3 is a schematic cross section side view of a preferred embodiment of the type of FIG. 1, illustrating the focusing effect due to aberrant fields near lens opening edges.

Referring to FIG. 3, the field created near the edge of the lens' opening will not focus electrons. With the invention, the large diameter lens achieves a focus permitting, for example, a spot size at least as small as ~35 nm, and preferably optimized to ~10 nm. Moving emissions further from the edge regions of the lens 16 will reduce or eliminate the unfocused aberrant emissions that occur from electron flight paths near the lens' edge.

Figure 4:
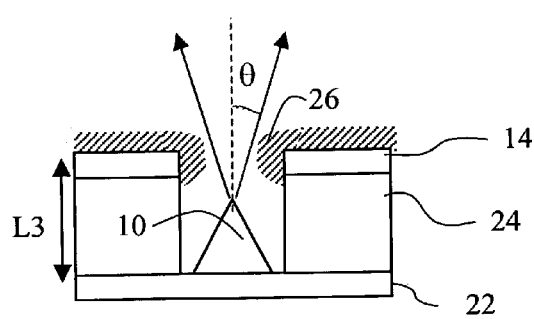
FIG. 4 is a schematic cross section side view of a preferred embodiment emitter and well with aperture usable with the FIG. 1 electronic device.

While some electron emission efficiency is lost, an alternate embodiment of the invention narrows the angle of divergence (see FIG. 4) by adding an aperture 26 on the extractor 14. The aperture 26 may be metal or any other material suitable to block emissions beyond the angle of divergence permitted by the aperture's opening. The aperture material should be a good conductor with a high melting point. Exemplary preferred materials include Mo, Ta, Nb, and carbides of these materials.

Figure 5:
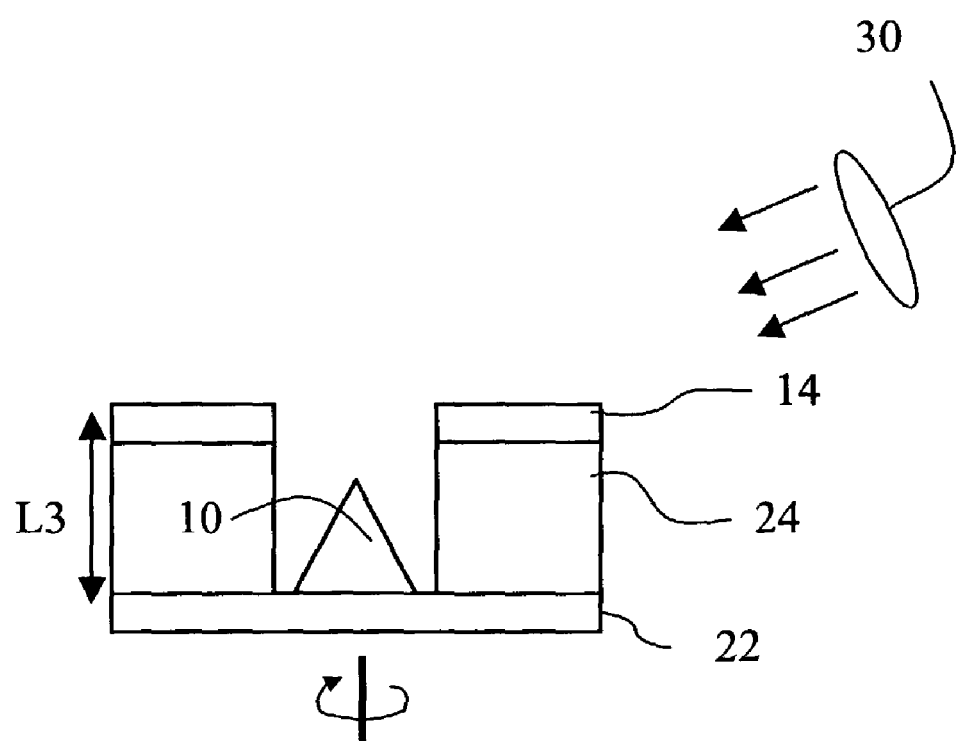
FIG. 5 is a schematic cross section side view illustrating a preferred method for forming the aperture of FIG. 4.

A preferred method for forming the aperture 26 is a low angle deposition upon the completed extractor layer, as illustrated in FIG. 5. For example, a sputter target 30 is set at an angle of 50–85° from normal, e.g., 75°. The deposition angle is low and the emitter/extractor substrate is rotating relative to the target 30 during deposition to evenly coat all sides of the well's opening.

Figure 6:
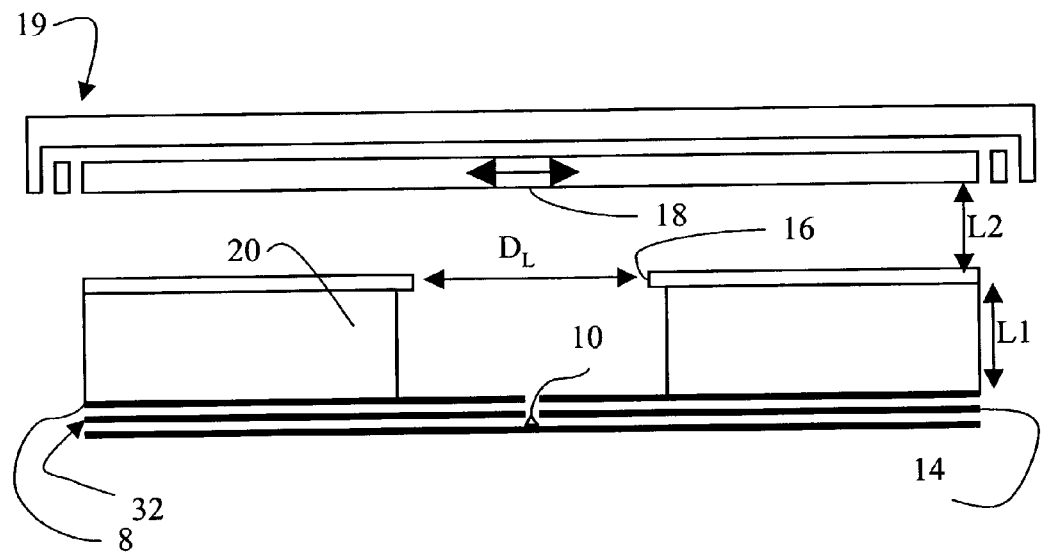
FIG. 6 is a schematic cross section side view of a preferred embodiment electronic device.
Figure 7:
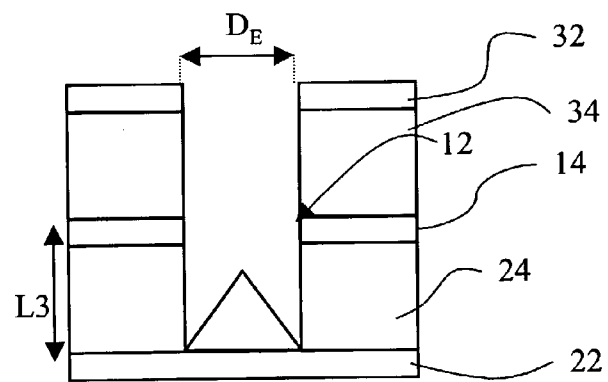
FIG. 7 is a schematic cross section side view of the emitter and well from the FIG. 6 electronic device.

Another alternate embodiment to improve spot size is shown in FIG. 6. This embodiment includes a conventional lens 32 as a collimating lens. The lens 32 is illustrated in FIG. 7, formed on a dielectric 34 that is formed on the extractor 14. The emissions from the lens 32 will be collimated toward the center, strongest focusing portion of the wide lens 16 spaced at the substantial distance from the lens 32. Emission efficiencies in the FIGS. 6 and 7 embodiment will be in the range of conventional emitter devices as the lens 32 close to the extractor performs as in devices lacking the wide and distant lens 16. However, the FIGS. 6 and 7 embodiment will achieve a smaller optimized spot size than the FIG. 1 embodiment and have improved spatial stability. The decreased output due to initial lensing or aperturing may be addressed by replacing a single emitter with an array of emitters, i.e., each wide and distant lens 16 receives output from an array of emitters 10.

Figure 8:
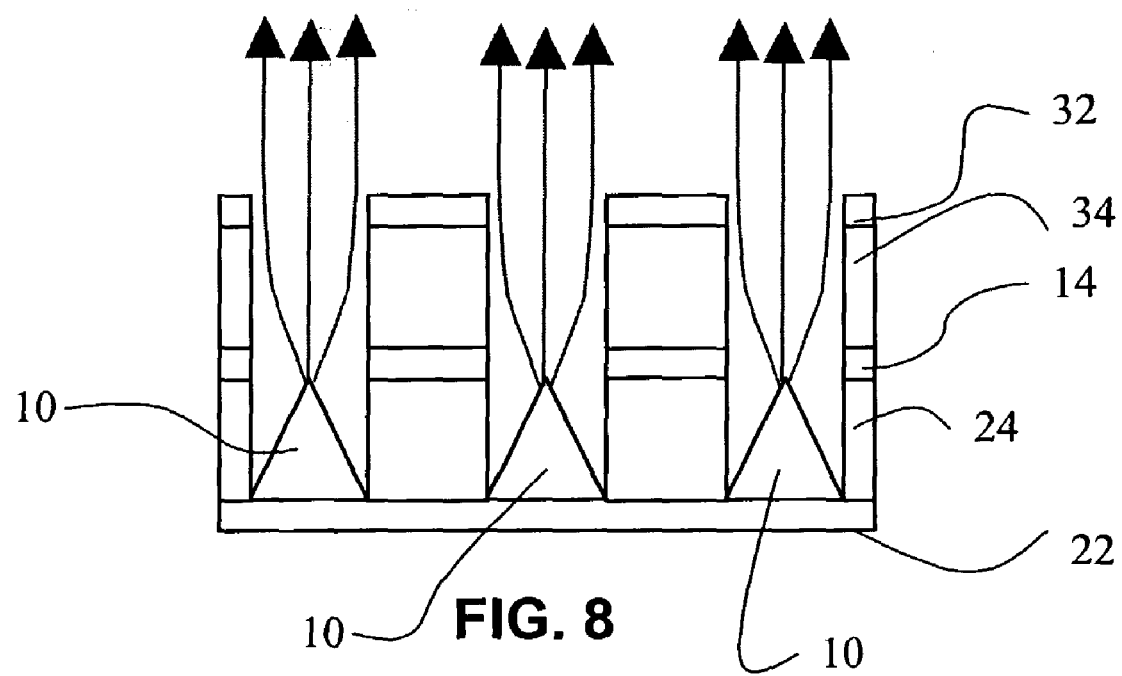
FIG. 8 is a schematic cross section side view of an alternate embodiment emitter and well array usable in the FIG. 6 electronic device.

The emitter 10, extractor 14 and initial lens 32 portion of this type of embodiment is illustrated in FIG. 8. Each emitter will have its collimated into an emission pattern 36, and a plurality of the emission patterns is focused into a spot by a wide and distant lens 16.

Figure 9:
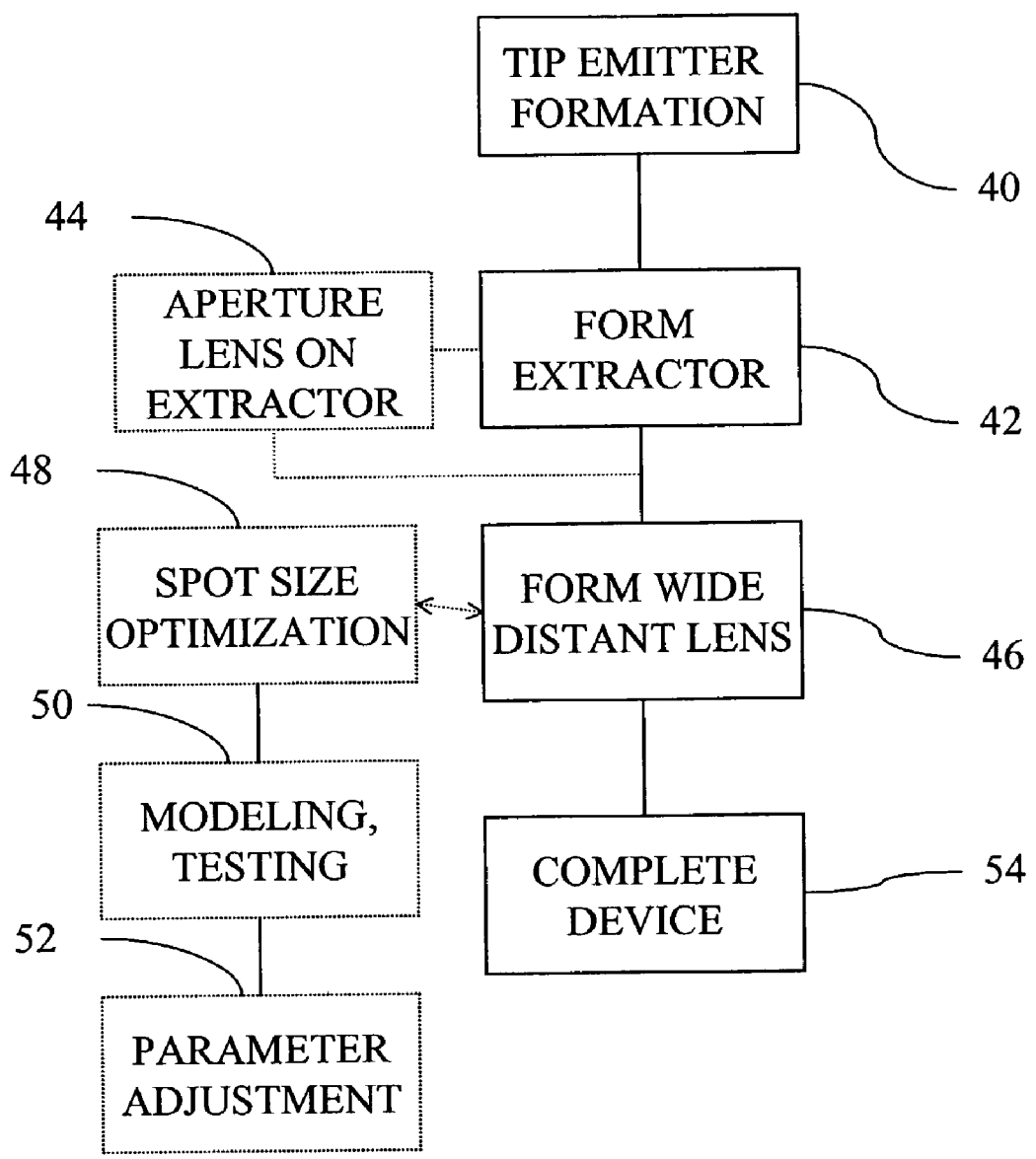
FIG. 9 illustrates a preferred method of forming an electronic device and a preferred method of reducing spot size by optimization.

The preferred embodiments illustrated above indicate a general method for reducing the spot size of a focused electron emission beam. Referring to FIG. 9, a method of reducing spot size and method of forming an electronic device of the invention are illustrated. A tip emitter is formed (step 40), preferably in shallow aspect ratio well. As a separate step or as part of the emitter formation, an extractor layer is formed about the tip emitter (step 42). Optionally, an aperture and lens or lens structure may be formed upon the extractor (step 44), for example, as part of a self-aligned formation process to form a lens. An aperture formation, as another example, is preferably carried out by a low angle deposition process as discussed with respect to FIG. 5. A wide and distant lens is then formed (step 46) in an independent process step from the extractor/tip/well formation, in accordance with the diameters and spacing discussed above. The wide and distant lens diameter and distance, along with any aperturing and initial lensing will affect spot size and power, and the spot size may be optimized (step 48) by adjusting any of these parameters. Optimization can include, for example, modeling and testing of prototype devices (step 50) with adjustment of various ones of the parameters (step 52). Competing goals of emission efficiency and spot size can be balanced during this process. While the diameter of the lens 16 may, in theory, be made arbitrarily wide, practical limits to its diameter exist, including the fact that increasing the lens' diameter will affect the number of lens/emitter device structures per unit area. In addition, the voltage required to operate the lens increases for greater openings. A device is then completed (step 54), according to application specific conventional steps. At a minimum, a target medium 18 is arranged at a focused emission point. The type of medium and number of additional steps will depend upon the specific application. In addition, any of the steps in FIG. 9 may be carried out as part of a process that also forms other duplicate structures. Also, the steps may be carried out as part of a semiconductor device integration process, for example, the extractor and lens structures may be part of a large scale integration formation process.

Specific applications of electronic device according to the invention will use different target media. The target medium 18 can be chosen to create different types of devices. Relative movement is created between the target medium and the focused emissions by application, for example, of a micromover to the target medium or to the wide lens/emitter structure. The target medium 18 may be a memory medium with the use of phase change material, an exemplary material being $In_2Se_3$. Other phase change materials are known to those skilled in the art. For a lithography application, an electron beam resist material is suitable, e.g., polymethylmethacrylate (PMMA). A few preferred embodiment applications will now be discussed, but are not intended to limit the invention to the particular applications.

Figure 10A:
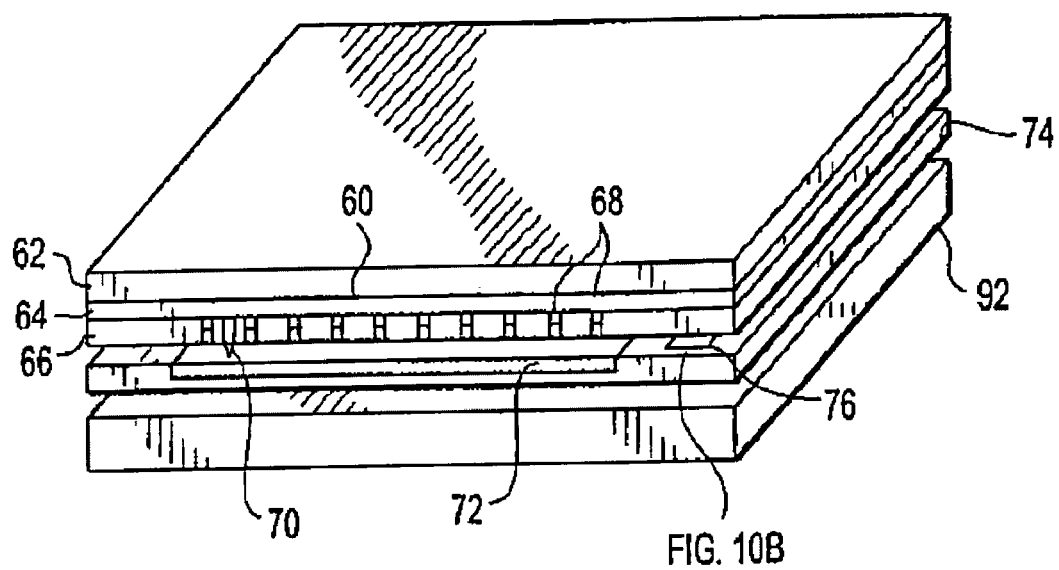
FIG. 10A is a schematic perspective view illustrating a preferred memory device of the invention.
Figure 10B:
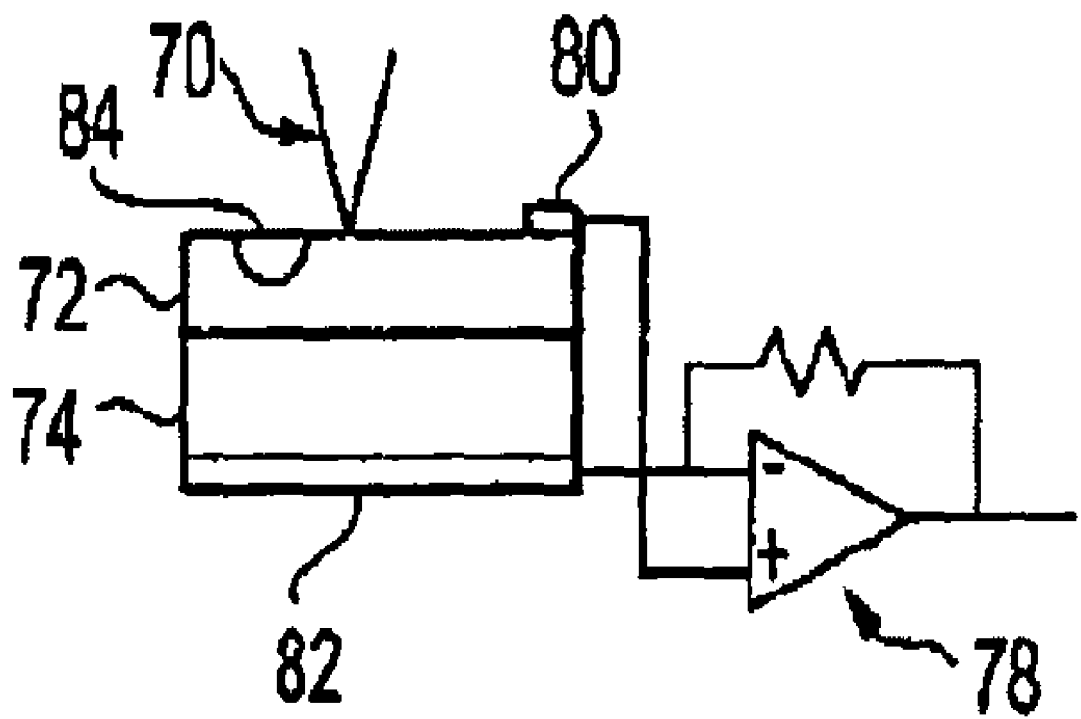
FIG. 10B illustrates a preferred embodiment reader circuit for the FIG. 10A memory device.

A preferred memory device is shown in FIGS. 10A and 10B. The embodiment generally has the FIG. 1 structure, replicated as an array of emitters and corresponding lenses. Specifically, the memory device includes a plurality of integrated tip emitters 60 formed in wells on an emitter substrate 62. The substrate 62 preferably comprises an integrated circuit (IC) including one a plurality of smaller integrated emitters 60 spaced apart by a dielectric 64 from a focusing array 66 having wide and distant focusing lenses 68. Each focusing lens 68 can controllably emit a focused beam 70 that is used to affect a recording surface, namely medium 72. Medium 72 is applied to a mover 74 that positions the medium 72 with respect to the focusing lenses 68 of the focusing array substrate 66. Preferably, the mover 74 has a reader circuit 76 integrated within. The reader 76 is shown as an amplifier 78 making a first ohmic contact 80 to medium 72 and a second ohmic contact 82 to mover 74, preferably a semiconductor or conductor substrate. The mover 74 is a rotor substrate that interacts with a stator substrate 83, which contains opposing electrodes (in regard to corresponding electrodes on the mover substrate 74) for positioning the mover substrate 74 relative to the stator 92. When a focused beam 70 strikes the medium 72, if the current density of the focused beam is high enough, the medium 72 is phase-changed to create an affected medium area 84. When a low current density focused beam 70 is applied to the medium 72 surface, different rates of current flow are detected by amplifier 78 to create reader output. Thus, by affecting the medium 72 with the energy from the emitter 60, information is stored in the medium using structural phase changed properties of the medium. An exemplary phase change material is $In_2Se_3$. A preferred lithography device has the same general structure as in FIG. 10A, but omits the reader circuit and replaces the phase change material with a wafer or wafers prepared for lithographic patterning.

Figure 11:
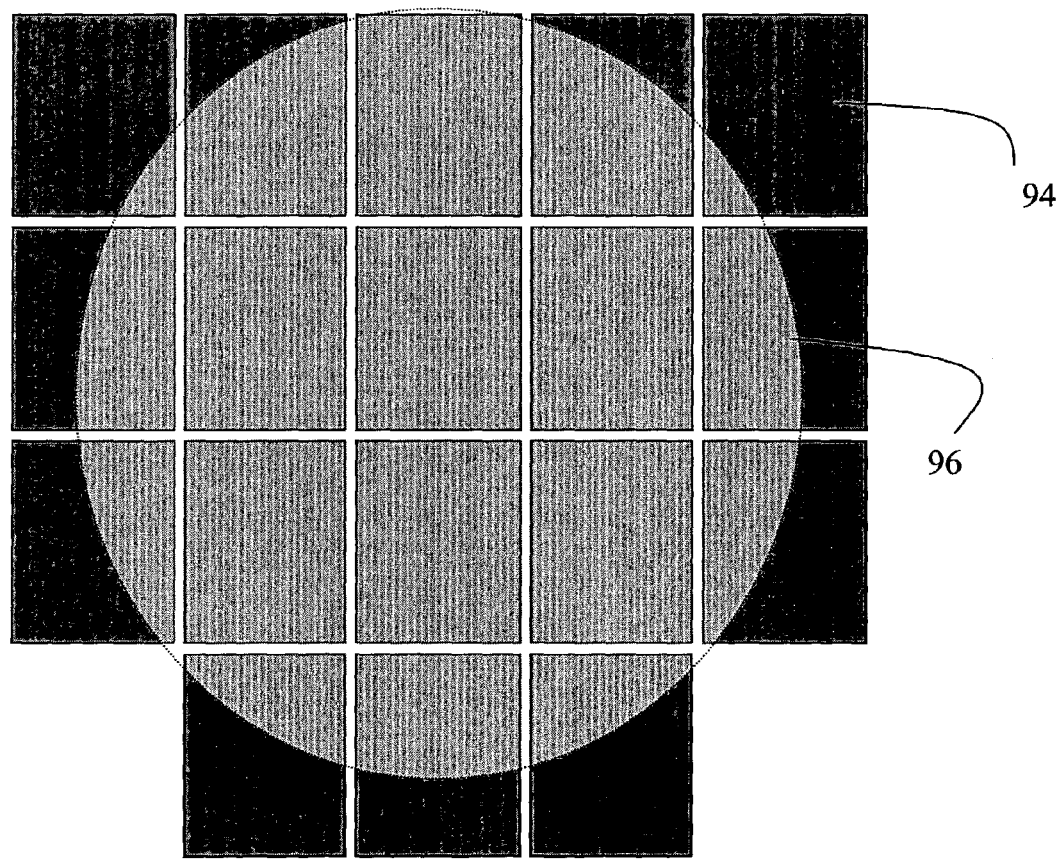
FIG. 11 is a schematic block diagram that illustrates a preferred embodiment lithography device of the invention.

FIG. 11 illustrates another preferred lithography arrangement, in which a plurality of bonded emitter chips and focusing arrays form e-beam generator arrays 94, and a wafer 96 is acted on as the target medium. Each e-beam generator array 94 has on it micromovers or nanomanipulators to position the array of beams over the correct area of the wafer 96. The wafer 92 can then be positioned underneath the arrays 94 to permit several patterns to be written. An alternative is to make emitter arrays large enough to each act on something as large as a full wafer to conduct full 6" (or larger) processing of the wafer underneath it. Another example is the use of multiple arrays having common movements to process a number of wafers in parallel, writing the same pattern to each wafer.

Figure 12:
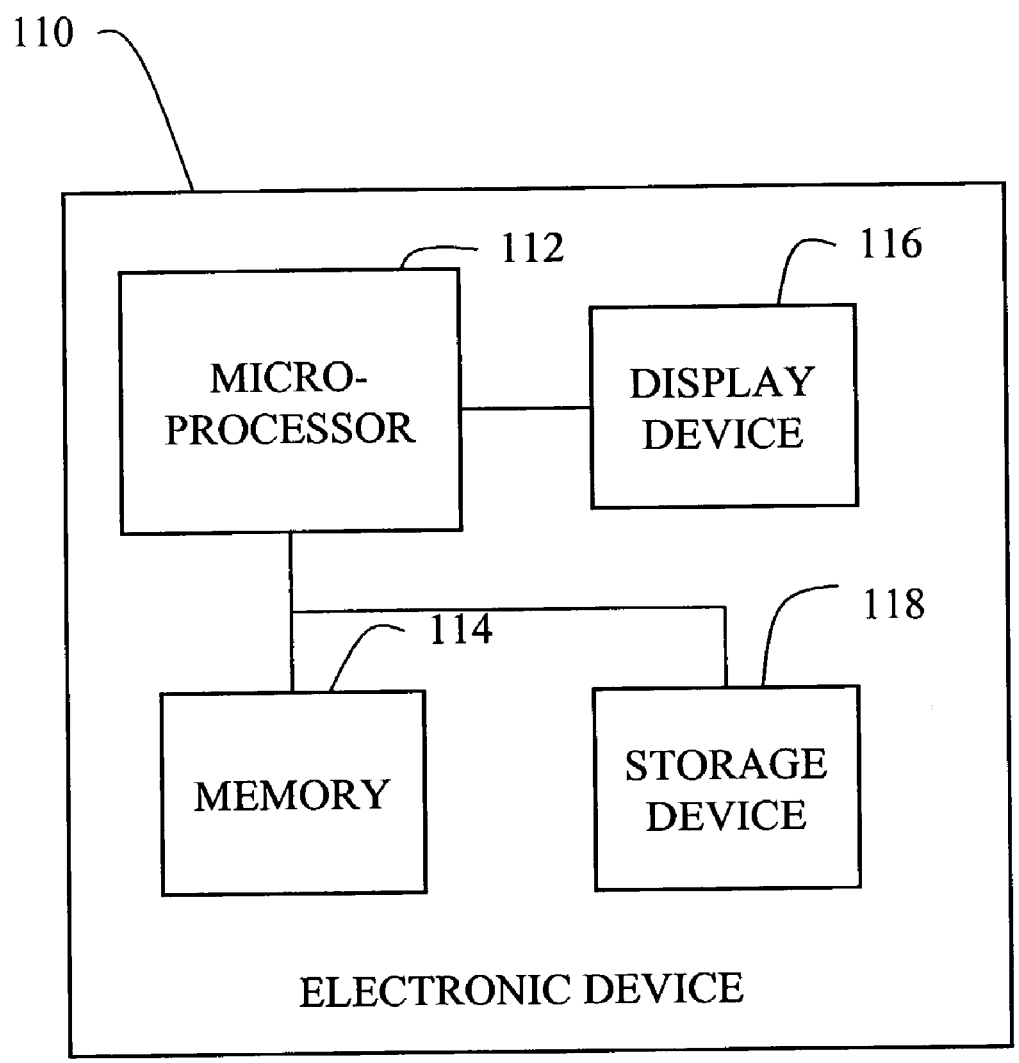
FIG. 12 is a block diagram that illustrates a preferred embodiment computer device of the invention.

FIG. 12 is an exemplary block diagram of an computer device 110, such as a computer, video game, Internet appliance, terminal, MP3 player, or personal data assistant to name just a few. The computer device 110 includes a microprocessor 112, such as an Intel Pentium Processor™ or compatible processor although other processors exist and are known to those skilled in the art. The microprocessor 112 is connected to a memory device 114 that includes computer readable memory that is capable of holding computer executable commands used by the microprocessor 112 to control data and/or input/output functions. Memory 114 can also store data that is manipulated by the microprocessor 112. The microprocessor 112 is also connected to either a storage device 116 or display device 118 or both. The storage device contains an embodiment of the invention as exemplified in earlier described figures and text showing emission devices that are focused with the wide and distant lens structure of the invention. Preferably, emitter devices of the invention are integrated on a common substrate with the microprocessor 112 and memory device 114.

While a specific embodiment of the present invention has been shown and described, it should be understood that other modifications, substitutions and alternatives are apparent to one of ordinary skill in the art. Such modifications, substitutions and alternatives can be made without departing from the spirit and scope of the invention, which should be determined from the appended claims.

Various features of the invention are set forth in the appended claims.

The invention claimed is:

1. An electronic device comprising:
a substrate;
a well defined in said substrate;
a tip emitter formed in said well;
an extractor disposed about said well to extract emissions from said tip emitter;
a wide lens for focusing said emissions through an opening defined in said wide lens, said opening having a sufficiently large diameter and being spaced far enough away from said extractor such that said sufficiently large diameter encompasses the majority of a divergence angle of said emissions and said emissions are focused by said wide lens to a spot; and
a target medium disposed at a distance away from said wide lens to receive said focused emissions;
wherein said sufficiently large diameter encompasses the entire divergence angle of said emissions; and
wherein said sufficiently large diameter is in the range of ~3 µm–~10 µm.

2. The electronic device of claim 1, wherein a distance between said wide lens and said extractor is in the range of ~3 µm–~10 µm and a ratio of said sufficiently large diameter and the distance between said wide lens and said extractor is between 1:1 and 6:1.

3. The electronic device of claim 2, wherein a dielectric layer creates said distance between said wide lens and said extractor.

4. The electronic device of claim 2, wherein said target medium is movable relative to said wide lens.

5. The electronic device of claim 4, wherein said target medium comprises a lithography medium.

6. The electronic device of claim 4, wherein said target medium comprises a memory medium.

7. An electronic device comprising:
a substrate;
a well defined in said substrate;
a tip emitter formed in said well;
an extractor disposed about said well to extract emissions from said tip emitter;
a wide lens for focusing said emissions through an opening defined in said wide lens, said opening having a sufficiently large diameter and being spaced far enough away from said extractor such that said sufficiently large diameter encompasses the majority of a divergence angle of said emissions and said emissions are focused by said wide lens to a spot; and
a target medium disposed at a distance away from said wide lens to receive said focused emissions;
wherein said well defined in said substrate has a depth to diameter aspect ratio in the approximate range of 0.75:1–1.25:1.

8. The electronic device of claim 7, wherein said well has a depth of ~0.5 µm.

9. An electronic device comprising:
a substrate;
a well defined in said substrate;
a tip emitter formed in said well;
an extractor disposed about said well to extract emissions from said tip emitter;
a wide lens for focusing said emissions through an opening defined in said wide lens, said opening having a sufficiently large diameter and being spaced far enough away from said extractor such that said sufficiently large diameter encompasses the majority of a divergence angle of said emissions and said emissions are focused by said wide lens to a spot; and
a target medium disposed at a distance away from said wide lens to receive said focused emissions;
wherein said wide lens is spaced far enough away to focus said emissions onto said medium in a spot size less than ~35 nm.

10. An electronic device comprising:
a substrate;
a well defined in said substrate;
a tip emitter formed in said well;
an extractor disposed about said well to extract emissions from said tip emitter;
a wide lens for focusing said emissions through an opening defined in said wide lens, said opening having a sufficiently large diameter and being spaced far enough away from said extractor such that said sufficiently large diameter encompasses the majority of a divergence angle of said emissions and said emissions are focused by said wide lens to a spot; and
a target medium disposed at a distance away from said wide lens to receive said focused emissions;
further comprising an aperture layer formed upon said extractor to limit the divergence angle of said emissions.

11. The electronic device of claim 10, wherein said aperture layer evenly coats sides of said well at said extractor.

12. An electronic device comprising:
a substrate;
a well defined in said substrate;
a tip emitter formed in said well;
an extractor disposed about said well to extract emissions from said tip emitter;
a wide lens for focusing said emissions through an opening defined in said wide lens, said opening having a sufficiently large diameter and being spaced far enough away from said extractor such that said sufficiently large diameter encompasses the majority of a divergence angle of said emissions and said emissions are focused by said wide lens to a spot; and
a target medium disposed at a distance away from said wide lens to receive said focused emissions;
further comprising an initial lens structure with an initial lens having a diameter equal to a diameter of said well, said initial lens focusing said emissions toward a center of said opening defined in said wide lens.

13. The electronic device of claim 12, wherein said well, said tip emitter, said extractor and said initial lens structure is replicated as an array so that emissions from a plurality of tip emitters are collimated within said opening defined in said wide lens.

14. An electronic device comprising:
a substrate;
a well defined in said substrate;
a tip emitter formed in said well;
an extractor disposed about said well to extract emissions from said tip emitter;
a wide lens for focusing said emissions through an opening defined in said wide lens, said opening having a sufficiently large diameter and being spaced far enough away from said extractor such that said sufficiently large diameter encompasses the majority of a divergence angle of said emissions and said emissions are focused by said wide lens to a spot; and
a target medium disposed at a distance away from said wide lens to receive said focused emissions;
wherein one of said target medium and said wide lens are movable with respect to the other.

15. The electronic device of claim 14, further comprising a mover to move said target medium relative to said wide lens.

16. An electronic device comprising:
a substrate;
a well defined in said substrate;
a tip emitter formed in said well;
an extractor disposed about said well to extract emissions from said tip emitter; and
a wide lens for focusing said emissions through an opening defined in said wide lens, said opening having a sufficiently large diameter and being spaced far enough away from said extractor such that said sufficiently large diameter encompasses the majority of a divergence angle of said emissions and said emissions are focused by said wide lens to a spot;
the electronic device being formed as part of a memory device, the memory device including a plurality of said tip emitters and comprising:
a plurality of respective wide lenses for focusing electron beams from the plurality of tip emitters to created focused beams; and
a memory medium at the focal point of the focused beams, the memory medium having a storage area being in one of a plurality of states to represent information stored in the storage area, the states being responsive to the focused beam such that
an effect is generated in the storage area when the focused beam impinges upon the storage area;
a magnitude of the effect depends upon the state of the storage area; and
information in the storage area is read by measuring the magnitude of the effect.

17. The electronic device of claim 16, further comprising:
a mover to position said memory medium with respect to said plurality of tip emitters; and
a reader circuit integrated in said mover.

18. A computer device including a plurality of electronic devices, each of the electronic devices comprising:
a substrate;
a well defined in said substrate;
a tip emitter formed in said well;
an extractor disposed about said well to extract emissions from said tip emitter; and
a wide lens for focusing said emissions through an opening defined in said wide lens, said opening having a sufficiently large diameter and being spaced far enough away from said extractor such that said sufficiently large diameter encompasses the majority of a divergence angle of said emissions and said emissions are focused by said wide lens to a spot;
the computer device further including a processor for controlling said electronic devices.

19. A mass storage device including a plurality of electronic devices each of the electronic devices comprising:
a substrate;
a well defined in said substrate;
a tip emitter formed in said well;
an extractor disposed about said well to extract emissions from said tip emitter; and
a wide lens for focusing said emissions through an opening defined in said wide lens, said opening having a sufficiently large diameter and being spaced far enough away from said extractor such that said sufficiently large diameter encompasses the majority of a divergence angle of said emissions and said emissions are focused by said wide lens to a spot;
the mass storage device further including a memory medium disposed at a focal point of said emissions.

20. An electronic device comprising:
a substrate;
a ~0.3—~0.5 µm diameter and ~0.4—~0.6 µm deep well defined in said substrate;
a tip emitter formed in said well;
an extractor disposed about said well to extract emissions from said tip emitter; and
a wide lens disposed a length of ~3 µm—~10 µm from said extractor for focusing said emissions through an at least a ~3 µm—~10 µm diameter opening defined in said wide lens, wherein a ratio of said diameter to said length is greater than 1:1.

21. The electronic device according to claim 20, further comprising a target medium disposed at a distance away from said wide lens to receive said focused emissions.

22. The electronic device of claim 21, wherein a dielectric layer creates said length.

23. The electronic device of claim 21, wherein said target medium is movable relative to said wide lens.

24. The electronic device of claim 23, wherein said target medium comprises a lithography medium.

25. The electronic device of claim 23, wherein said target medium comprises a memory medium.

26. The electronic device of claim 21, wherein said well defined in said substrate has a depth to diameter aspect ratio in the approximate range of 0.75:1–1.25:1.

27. The electronic device of claim 21, further comprising an aperture layer formed upon said extractor to limit the divergence angle of said emissions.

28. The electronic device of claim 27, wherein said aperture layer evenly coats sides of said opening defined in said wide lens.

29. The electronic device of claim 21, further comprising means for limiting a divergence angle of said emissions prior to said extractor.

30. The electronic device of claim 21, further comprising an initial lens structure with an initial lens having a diameter equal to a diameter of said well, said initial lens collimating said emissions toward a center of said opening defined in said wide lens.

31. The electronic device of claim 30, wherein said well, said tip emitter, said extractor and said initial lens structure is replicated as an array so that emissions from a plurality of tip emitters are collimated toward said center of said opening defined in said wide lens.

32. The electronic device of claim 21, wherein one of said target medium and said wide lens are movable with respect to the other.

33. The electronic device of claim 32, further comprising a mover to move said target medium relative to said wide lens.

34. The electronic device of claim 20, formed as part of a memory device, the memory device including a plurality of said tip emitters and comprising:
a plurality of respective wide lenses for focusing electron beams from the plurality of tip emitters to created focused beams; and
a memory medium at the focal point of the focused beams, the memory medium having a storage area being in one of a plurality of states to represent information stored in the storage area, the states being responsive to the focused beam such that
an effect is generated in the storage area when the focused beam impinges upon the storage area;
a magnitude of the effect depends upon the state of the storage area; and
information in the storage area is read by measuring the magnitude of the effect.

35. The electronic device of claim 34, further comprising:
a mover to position said memory medium with respect to said plurality of tip emitters; and
a reader circuit integrated in said mover.

36. A computer device including a plurality of the electronic devices of claim 20, the electronic device including a processor for controlling said electronic devices integrated on said substrate with said electronic devices.

37. A mass storage device including a plurality of the electronic devices of claim 20, the mass storage device including a memory medium disposed at a focal point of said emissions.

38. An electronic device comprising:
a substrate;
a well defined in said substrate having a depth to diameter aspect ratio in the approximate range of 0.75:1–1.25:1;
a tip emitter formed in said well;
an extractor disposed about said well to extract emissions from said tip emitter; and
a wide lens for focusing said emissions through an opening defined in said lens, said lens being spaced apart from said extractor.

39. The electronic device of claim 38, wherein said lens a relationship of the diameter of said lens compared to the distance said lens is spaced apart from said extractor is between 1:1 and 6:1.

40. The electronic device of claim 39, wherein the diameter of said lens is ~3 to ~10 µm.

41. The electronic device of claim 40, wherein the distance said lens is spaced apart from said extractor is ~5 µm.

42. The electronic device of claim 41, wherein said well has a ~0.3—~0.5 µm diameter and is ~0.4—~0.6 µm deep.

43. The electronic device of claim 39, further comprising a target medium disposed ~1—~10 µm from said wide lens.

44. The electronic device of claim 43, wherein said wide lens has a diameter $D_L$ ~7.5 µm, said well has a diameter $D_E$ ~0.5 µm, a distance L1 said wide lens is spaced apart from said extractor is ~5 µm, a distance L2 said target medium is disposed from said wide lens is ~3 µm, a depth L3 of said well is ~0.4 µm.

45. An electronic device comprising:
a substrate;
a well defined in said substrate;
a tip emitter formed in said well;
an extractor disposed about said well to extract emissions from said tip emitter; and
a wide lens spaced apart from said extractor for focusing said emissions through an opening defined in said wide lens, said opening having a diameter greater than a diameter of said well;

wherein said lens a relationship of the diameter of said lens compared to the distance said lens is spaced apart from said extractor is between 1:1 and 6:1.

46. An electronic device comprising:
a substrate;
a well defined in said substrate;
a tip emitter formed in said well;
an extractor disposed about said well to extract emissions from said tip emitter; and
a wide lens spaced apart from said extractor for focusing said emissions through an opening defined in said wide lens, said opening having a diameter greater than a diameter of said well;
wherein the diameter of said lens is ~3 to ~10 μm.

47. An electronic device comprising:
a substrate;
a well defined in said substrate;
a tip emitter formed in said well;
an extractor disposed about said well to extract emissions from said tip emitter; and
a wide lens spaced apart from said extractor for focusing said emissions through an opening defined in said wide lens, said opening having a diameter greater than a diameter of said well;
wherein the distance said lens is spaced apart from said extractor is ~5 μm.

48. An electronic device comprising:
a substrate;
a well defined in said substrate;
a tip emitter formed in said well;
an extractor disposed about said well to extract emissions from said tip emitter; and
a wide lens spaced apart from said extractor for focusing said emissions through an opening defined in said wide lens, said opening having a diameter greater than a diameter of said well;
wherein said well has a ~0.3—~0.5 μm diameter and is ~0.4—~0.6 μm deep.

49. An electronic device comprising:
a substrate;
a well defined in said substrate;
a tip emitter formed in said well;
an extractor disposed about said well to extract emissions from said tip emitter; and
a wide lens spaced apart from said extractor for focusing said emissions through an opening defined in said wide lens, said opening having a diameter greater than a diameter of said well;
further comprising a target medium disposed ~1—~10 μm from said wide lens.

50. An electronic device comprising:
a substrate;
a well defined in said substrate;
a tip emitter formed in said well;
an extractor disposed about said well to extract emissions from said tip emitter; and
a wide lens spaced apart from said extractor for focusing said emissions through an opening defined in said wide lens, said opening having a diameter greater than a diameter of said well;
wherein said wide lens has a diameter $D_L$ ~7.5 μm, said well has a diameter $D_E$ ~0.5 μm, a distance L1 said wide lens is spaced apart from said extractor is ~5 μm, a distance L2 said target medium is disposed from said wide lens is ~3 μm, a depth L3 of said well is ~0.4 μm.

51. An electronic device, comprising:
a substrate:
a well defined in said substrate;
a tip emitter formed in said well;
an extractor disposed about said well to extract emissions from said tip emitter; and
means for focusing said emissions into spot size of less than ~35 nm.

52. The electronic device of claim 51, wherein said means for focusing are formed independently from said well, said tip emitter and said extractor.

53. The electronic device of claim 51, wherein said means for focusing comprises an electrostatic lens that has a diameter greater than a diameter of said well.

54. The electronic device of claim 51, further comprising means for collimating said emissions toward said means for focusing.

* * * * *